United States Patent [19]

Riccitelli

[11] 3,934,122

[45] Jan. 20, 1976

[54] ELECTRONIC SECURITY CARD AND SYSTEM FOR AUTHENTICATING CARD OWNERSHIP

[76] Inventor: James A. Riccitelli, 2257 Glenkirk Drive, San Jose, Calif. 95124

[22] Filed: Aug. 15, 1974

[21] Appl. No.: 497,734

[52] U.S. Cl... 235/61.7 B; 340/149 A; 235/61.12 N

[51] Int. Cl.[2] ..................... G11C 7/00; G11C 19/00

[58] Field of Search...235/61.7 B, 61.11 H, 61.12 C, 235/61.12 N; 340/149 A

[56] References Cited

UNITED STATES PATENTS

| | | | |
|---|---|---|---|
| 3,637,994 | 1/1972 | Ellingboe | 235/61.12 N |
| 3,641,316 | 2/1972 | Dethloff | 235/61.7 B |
| 3,678,251 | 7/1972 | Delpino | 235/61.12 C |
| 3,702,464 | 11/1972 | Castrucci | 235/61.12 N |
| 3,831,119 | 8/1974 | Ambrosio | 235/61.12 C |
| 3,868,057 | 2/1975 | Chavez | 235/61.7 B |

*Primary Examiner*—Stanley M. Urynowicz, Jr.
*Attorney, Agent, or Firm*—Schatzel & Hamrick

[57] ABSTRACT

An electronic security card and system for authenticating ownership of the card is disclosed. The system comprises a security card and a terminal. The security card includes logic circuitry which is responsive to a plurality of input signals and which is operative to provide an output signal if the input signals are in a preselected sequence and to develop a feedback control signal which is applied to, and deactivates, the logic circuitry if the input signals are not in the preselected sequence. The terminal comprises a source of input signals, a switching network for selectively interconnecting the source to the logic circuitry so as to apply a sequence of input signals to the logic circuitry when the security card is received by the terminal, and an indicator responsive to the output signal and operative to provide an indication of the authenticity of the user of the security card. The logic circuitry includes a plurality of stages, each of which comprises an AND gate and a flip-flop, and which is arranged so that the signal developed at the output of one of the stages is applied to gate a preceding stage.

9 Claims, 2 Drawing Figures

ELECTRONIC SECURITY CARD AND SYSTEM FOR AUTHENTICATING CARD OWNERSHIP

BACKGROUND OF THE INVENTION

1. Field of the Invention

This invention relates to an electronic security card and to a system for authenticating ownership of the card and, more particularly, to such a security card including logic circuitry adapted to provide an output signal if input signals to the circuitry are in a preselected sequence and which is deactivated if the input signals are not in the predetermined sequence.

2. Description of the Prior Art

Credit cards have become a popular and widely used technique for purchasing goods and services. A major problem, however, resides in the use of credit cards or any other security cards by unauthorized persons. The prior art is replete with credit or security cards and systems for authenticating the cards.

Examples of authenticating systems and security cards are found in the following U.S. Pat. Nos. 3,221,304, entitled "Electronic Identification System Employing a Data Bearing Identification Card," by O. C. Enikeieff et al.; 3,401,830, entitled "Vending Machine for Credit Card Purchasing," by H. A. Mathews; 3,513,298, entitled "High Security Credit Card System," by J. B. Riddle et al.; 3,697,729, entitled "Dispensing System and Security Card for Use Therewith," by Edwards et al.; 3,719,804, entitled "Permanent Information Store," by D. A. Illing; 3,740,530, entitled "Apparatus and Method for Verification of a Credit Card," by Hoffer et al.; 3,750,828, entitled "Access-Control Equipment and Item Dispensing Systems Including Such Equipment," by G. E. P. Constable.

However, in the authenticating systems disclosed in the prior art the security cards contain a code which is read by a reader and compared to a code which is inserted by the person using the card. Accordingly, the cards are passive devices and their codes may easily be determined.

SUMMARY OF THE INVENTION

It is therefore an object of the present invention to provide an electronic security card and a system for authenticating that the user is the owner of the card.

Another object of the present invention is to provide a security card which is operative if input signals are applied thereto in a preselected sequence and which is deactivated if the input signals are not in the preselected sequence.

Still another object is to provide such a system which includes a security card that cannot be decoded by a person gaining possession of the terminal or through other means.

In accordance with the present invention, an electronic security card and a system for authenticating card ownership is provided. The security card includes logic circuitry which is responsive to a plurality of input signals. An output signal is provided by the card if the input signals are in a preselected sequence. If the input signals are not in the preselected sequence, a feedback control signal is developed and applied to deactivate the logic circuitry. The system includes a terminal for receiving the security card. The terminal includes a source to provide a plurality of input signals, a switching network for selectively interconnecting the source to the logic circuitry so as to apply a sequence of the input signals to the logic circuitry when the security card is received by the terminal, and indicating means responsive to the output signal and operative to provide an indication that the user is the owner of the card. The logic circuitry comprises a plurality of stages which are arranged so that the signal developed at the output of one of the stages is applied to gate a preceding stage. Each stage includes an AND gate and a bistable multivibrator.

Among the advantages of the present invention is that the security card code cannot be determined by a person gaining possession of a terminal or through other means.

Another advantage of the present invention is that the security card produces acknowledgment, or identification, of the holder when the holder keys in signals in a preselected sequence.

Still another advantage of the present invention is that operation of the system is inhibited if an incorrect sequence of signals is provided to the security card until such time as the circuitry within the card is reset.

Other objects and advantages will be apparent to those skilled in the art after having read the following detailed disclosure which makes reference to the several figures of the drawing.

IN THE DRAWING

FIG. 1 is a schematic diagram of an authenticating system of the present invention illustrating electronic circuitry associated with the electronic security card and the terminal; and FIG. 2 is a perspective view of the security card of the present invention.

DETAILED DESCRIPTION OF THE PREFERRED EMBODIMENT

Figure 1:
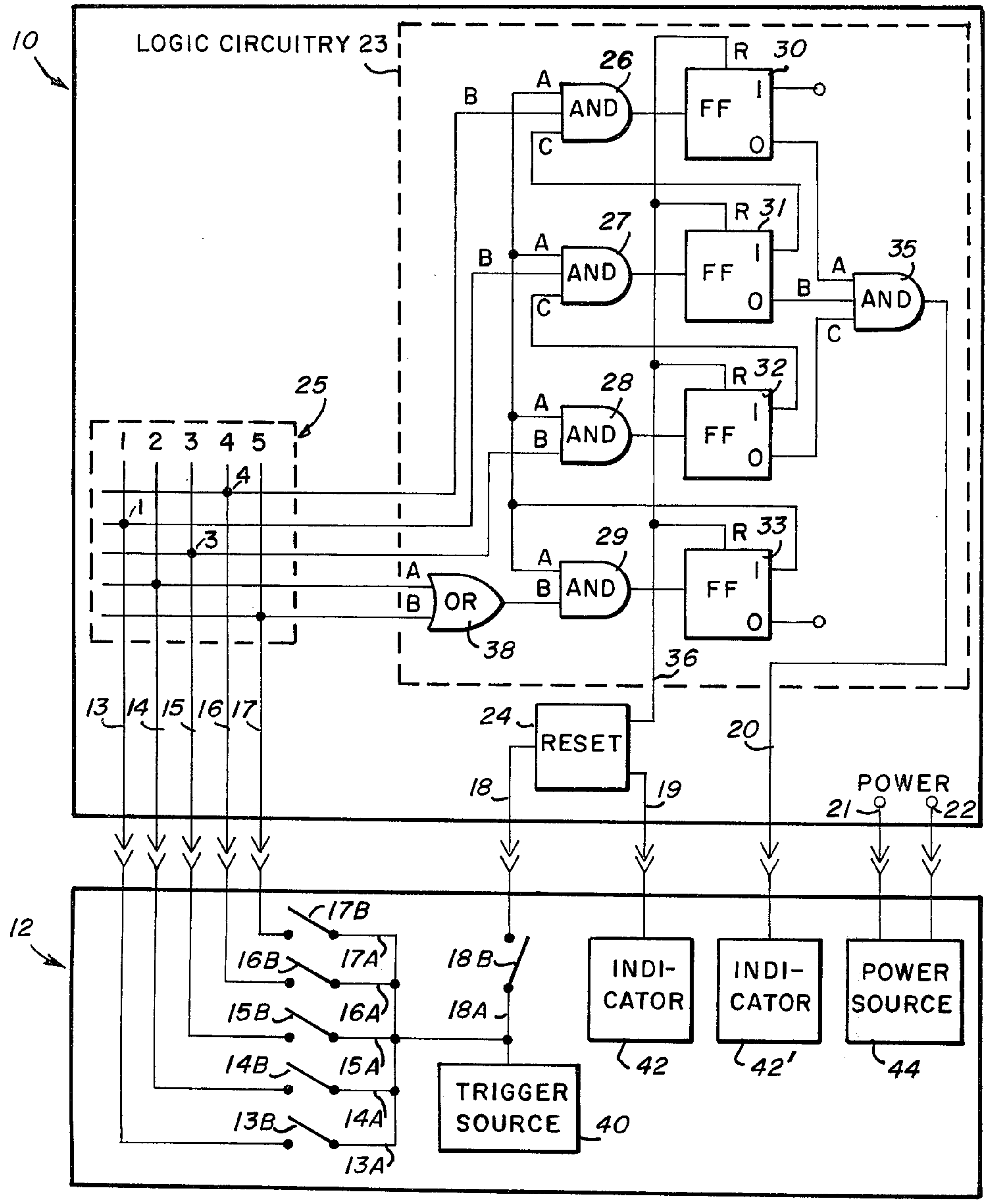
Figure 2:
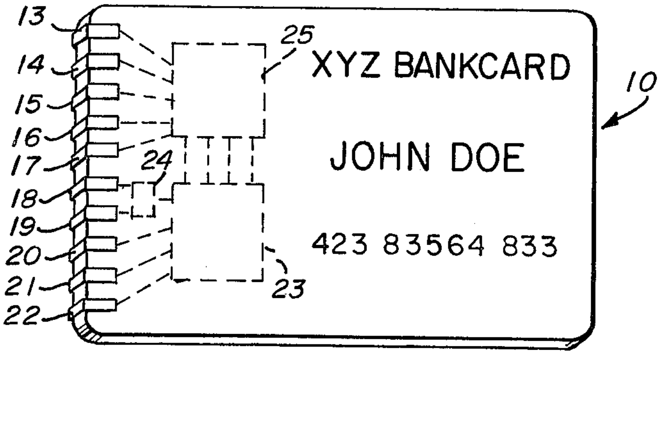

FIG. 1 illustrates a schematic diagram of an authenticating system of the present invention. The system comprises a security card designated by the general reference numeral 10 and a terminal or means for authenticating the card designated by the general reference numeral 12. The security card 10 is further illustrated in FIG. 2 as an integral molded structure encapsulating a plurality of conductors 13–22; a logic circuit network 23; a reset pulse generator 24, such as a monostable single shot multivibrator; and a selector grid network 25.

In the preferred embodiment the logic circuitry 23 and reset pulse generator 24 are provided in an integrated circuit and encapsulated along with the selector grid 25 in opaque plastic so as to form the security card 10. The security card 10 is about the same size as present-day credit cards. Card 10 is rigid enough to prevent damage to the integrated circuits, but flexible enough to be carried in a wallet.

The logic circuit network 23 comprises four stages. The stages each include an AND gate 26, 27, 28, and 29 that is serially connected to a respective flip-flop 30, 31, 32 and 33, or bistable multivibrator. AND gates 26 and 27 include A, B and C input terminals and AND gates 28 and 29 include A and B input terminals. Each of flip-flops flip-flots 30–33 includes a pair of output terminals. One of the output terminals is in the initially OFF state and is represented by a logical "0", and the other output terminal is in the initially ON state and is represented by a logical "1". The initially ON output terminals of the flip-flops 31 and 32 are respectively connected to the C input terminal of AND gates 26 and 27 respectively. The initially ON output terminal of flip-flop 33 is connected to the A input terminal of each of the AND gates 26–29. The initially ON output terminal of the flip-flop 30 is unconnected. Accordingly, conductive paths are provided from the output of one of the stages of the logic circuitry to the input terminals of a preceding stage. In accordance with the present invention, the person holding the card keys in a preselected sequence of digits to the terminal 12, thereby causing the generation of a corresponding sequence of input signals. If the input signals are not in the preselected sequence, then paths are provided such that feedback control signals can be applied to preceding states to deactivate the logic circuitry as will be hereinafter described. The normally OFF output terminals of the flip-flops 30, 31, and 32 are respectively connected to the A, B and C input terminals of an AND gate 35. Consequently, AND gate 35 is rendered conductive only if flip-flops 30, 31 and 32 are caused to change state. A conductor 36 connects the output terminal of the reset pulse generator 24 to corresponding reset terminals R of the flip-flops 30–33 so as to reset the flip-flops to their initial conditions after the reset pulse generator 24 is appropriately energized. Conductor 20 serves as the output terminal of the AND gate 35 and terminates at one edge of the security card 10.

The selector grid network 25 interconnects the conductors 13–17 and the logic circuit 23. Conductors 14 and 17 are connected to the input terminals A and B respectively of an OR gate 38. An output terminal of the OR gate 38 is connected to the B input terminal of the AND gate 29. Conductors 16, 13 and 15 are respectively connected to the B input terminals of the AND gates 26, 27 and 28. These interconnections in the selector grid network 25 define a preselected code which must be keyed in by the user of the card in order for the system to authenticate that the user is the owner of the security card. As shown, the preselected code comprises the sequence of digits 4-1-3. It is recognized that other sequences of digits may be formed by merely rearranging the connections in the selector grid network 25 between the conductors 13–17 and the logic circuitry 23.

The terminal 12 houses a trigger source 40 which is connected to a plurality of conductors 13A, 14A, 15A, 16A, 17A and 18A. The conductors 13A – 17A terminate in an appropriate socket, preferably at one surface of the terminal 12 and serve to mate with the corresponding conductors 13–17 of the security card 10. A switching network comprising switches 13B–17B and reset switch 18B serves to selectively interconnect the source 40 to the conductors 13–18 of the security card 10. A reset indicator 42 is disposed on a display panel of the housing and is electrically connected to mate with the conductor 19 at the output of the reset pulse generator 24. An authenticity indicator 42' is also disposed on the display panel and is arranged so as to mate with the output conductor 20 from the AND gate 35. The authenticity indicator 42' is energized when the preselected sequence of input signals is applied to the logic circuitry 23 and an output signal is present at the output of the AND gate 35. The terminal 12 also houses a DC power source 44 which is coupled through the conductors 21 and 22 to energize the electronics of the security card 10.

The operation of the authenticating system will be described assuming that the holder keys the logic circuitry in the correct code sequence. The security card 10 is inserted in the terminal 12 with the conductors 13–22 plugged into the corresponding mating conductors of the terminal 12. The first operation is to reset the logic circuitry 23. Accordingly, the reset switch 18B is depressed such that the reset pulse generator 24 is energized, thereby activating the reset indicator 42 and causing a reset pulse after a set interval to be applied through conductor 36 to initialize the flip-flops 30–33.

Thereafter the holder or user of the card depresses the appropriate switch 13B–17B so as to provide the first digit in the preselected code to the logic circuitry. In this case, since the code is 4-1-3, switch 16B is depressed. It should be noted that for additional security the switches should be of the "momentary on" type, which typically do not remain closed during the period they are depressed. As switch 16B is depressed a trigger pulse is conducted from trigger source 40 through the AND gate 26 to flip-flop 30, causing the flip-flop 30 to change state. Accordingly, a first enable signal is applied to the A input terminal of AND gate 35. Thereafter, switch 13B is activated, such that a trigger pulse is applied through conductor 13 to the B input of the AND gate 27 causing the signals appearing on the output terminals of the flip-flop 31 to change state. Consequently, a second or disenable signal is applied to the B input terminal of the AND gate 35 and to the C input terminal of AND gate 26, thus deactivating the first stage of the logic circuitry. Finally, switch 15B is depressed, causing a pulse from trigger source 40 to be conducted on conductor 15 to the B input of the AND gate 28, causing the output signals of the flip-flop 32 to change state. Accordingly, a third enable signal is produced at the C input of the AND gate 35. Since first, second and third signals are present at the respective A, B and C inputs of the AND gate 35, an output signal is developed on conductor 20 which energizes the authenticity indicator 42', thereby indicating that the selector switches have been operated in the correct sequence and verifying that the user of the security card knows the correct code.

It should be recognized that if the user does not key the preselected code into the terminal 12, then the authenticity indicator 42 would not be energized. For example, assuming again that the correct code sequence is 4-1-3, if, after switches 18B and 16B have been operated, the user depresses switch 15B, then a pulse would appear on conductor 15 to the B input terminal of the AND gate 28, consequently causing the output signals of the flip-flop 32 to change state. Accordingly, a logic zero is applied to the C input of the AND gate 27, thereby disabling AND gate 27 until the reset switch 18B is once again actuated. Since AND gate 27 is disabled, flip-flop 31 will not change state. Thus, AND gate 35 is inhibited and the authenticity indicator 42' cannot be energized. In another example, if the switch 13B is closed instead of 16B, then a trigger pulse will be conducted through the selector grid network 25, the AND gate 27 and the flip-flop 31 such that the AND gate 35 is gated OFF, thereby inhibiting operation of indicator 42'. Similarly, if any of the switches 13B through 17B are actuated in an improper sequence, then the authenticity indicator 42' will not be energized.

For the three digit code 4-1-3, if switch 17B is actuated, a pulse would appear on conductor 17 at the B input of the OR gate 38 causing the OR gate 38 to conduct such that the pulse is conducted through AND gate 29 to the flip-flop 33. Consequently, a logical zero signal would appear at A input of the AND gates 26–29, thereby inhibiting further operation of the logic circuitry 23 until the flip-flops 30-33 are reset. The same result occurs if switch 14B is actuated.

While there has been described what is at present considered to be the preferred embodiment of the invention, it will be understood that various modifications may be made therein, and it is intended to cover in the appended claims all such modifications as falls within the true spirit and scope of the invention.

What is claimed is:

1. A system for authenticating the ownership of an electronic security card comprising:

a security card means including logic circuitry which is responsive to a plurality of input signals and is adapted to provide an output signal when said input signals are in a preselected sequence and to develop a feedback control signal which is applied to and deactivates said logic circuitry when said input signals are not in said preselected sequence; and terminal means for receiving said security card means, said terminal means including a signal source operative to provide a plurality of input signals, a switch means for selectively interconnecting said signal source means to said logic circuitry so as to apply a sequence of said input signals to said logic circuitry when said security card means is received by said terminal means, and indicating means responsive to said output signal and operative to indicate that said selective interconnection occurs in a predetermined manner.

2. A system for authenticating the ownership of an electronic security card as recited in claim 1 wherein said logic circuitry includes a plurality of stages arranged so that the signal developed at the output of one of said stages is applied to the input of a preceding stage so as to gate said preceding stage.

3. A system for authenticating the ownership of an electronic security card as recited in claim 2 wherein said security card means further includes reset means for initializing each of said stages, and wherein said terminal means includes means for energizing said reset means, and reset indicating means responsive to said reset means to provide an indication when said logic circuitry is initialized.

4. A system for authenticating the ownership of an electronic security card as recited in claim 3 wherein said logic circuitry further includes a plurality of conductors for carrying said input signals, said conductors being connected to said reset means, and wherein said security card means further includes an integral molded structure encapsulating said logic circuitry, said reset means and said conductors, said conductors extending within said structure so as to terminate at one edge thereof.

5. A system for authenticating the ownership of an electronic security card comprising:

a security card including a first stage having a first AND gate with first, second and third input terminals, a first bistable multivibrator serially connected to said first AND gate and having an initially-off output terminal, a second stage having a second AND gate with first, second and third input terminals, a second bistable multivibrator serially connected to said second AND gate and having an initially-on output terminal and an initially-off output terminal, the initially-on terminal being connected to said third input terminal of said first AND gate; a third stage having a third AND gate with first and second input terminals, and a third bistable multivibrator serially connected to said third AND gate and including an initially-on output terminal and an initially-off output terminal, the initially-on terminal being connected to said third input terminal of said second AND gate; a fourth stage having an OR gate with a plurality of input terminals, a fourth AND gate serially connected to said OR gate and including a first input terminal, and a fourth bistable multivibrator serially connected to said fourth AND gate and including an initally-on output terminal that is connected to said first input terminals of said first, second, third and fourth AND gates; a fifth AND gate connected to said initially-off output terminals of said first, second and third multivibrators and including an output terminal; a first plurality of conductors selectively connected to said second input terminals of said first, second and third AND gates and said plurality of input terminals of said OR gate; and reset means coupled to said first, second, third and fourth bistable multivibrators for initializing the corresponding output terminals thereof; and means for receiving said security card and including source means operative to provide a plurality of input signals; a second plurality of conductors coupled to said source means and arranged to mate with respective ones of said first plurality of conductors of said security card when said security card is received; switch means for selectively interconnecting said source means and one of said first plurality of conductors of said security card such that a sequence of said input signals is selectively applied to said AND gates, whereby when said sequence is such that input signals are applied consecutively to said first, second and third AND gates then an output signal is developed on said output terminal of said fifth AND gate, and when said input signals are applied in any other sequence or to said fourth stage, then said first, second, third and fourth AND gates are deactivated; and indicating means responsive to said output signal and operative to indicate when said proper sequence has been applied.

6. An electronic security card for use in a system for authenticating the ownership of said security card which includes a card authenticator for receiving said security card, said authenticator housing an electronic source operative to provide a plurality of input signals, switch means for selectively interconnecting said source to said security card and indicating means responsive to an output signal and operative to indicate when a predetermined interconnection is made, said security card comprising:

a logic circuitry network responsive to a plurality of input signals and operative to provide an output signal when said input signals are in a preselective sequence and to develop a feedback control signal which is applied to and deactivates said logic circuitry network when said input signals are not in said preselected sequence; and a conductive means for interconnecting said logic circuitry network to said switch means and said indicating means, said logic circuitry network and said conductive means being encapsulated within a card-shaped plastic member.

7. An electronic security card as recited in claim 6 wherein said logic circuitry network includes a plurality of stages arranged so that the signal developed at the output of one of said stages is applied to the input of a preceding stage to gate said preceding stage.

8. An electronic security card as recited in claim 6 wherein said card authenticator includes reset indicating means to provide an indication when said logic circuitry network is initialized, said security card including reset means coupled between said switch means and said reset indicating means for initializing each of said stages.

9. An electronic security card as recited in claim 6 wherein said logic circuitry network includes:

a first stage having a first AND gate with first, second and third input terminals, and a first bistable multivibrator serially connected to said first AND gate and having an initially-off output terminal;

a second stage having a second AND gate with first, second and third input terminals, a second bistable multivibrator serially connected to said second AND gate and having an initially-on output terminal and an initially-off output terminal, the last mentioned initially-on terminal being connected to said third input terminal of said first AND gate;

a third stage having a third AND gate with first and second input terminals, and a third bistable multivibrator serially connected to said third AND gate and including an initially-on output terminal and an initially-off output terminal, the last mentioned initially-on output terminal being connected to said third input terminal of said second AND gate;

a fourth stage having an OR gate with a plurality of input terminals, a fourth AND gate serially connected to said OR gate and including a first input terminal, and a fourth bistable multivibrator serially connected to said fourth AND gate and including an initially-on output terminal that is connected to said first input terminals of said first, second, third and fourth AND gates;

a fifth AND gate connected to said initially-off output terminals of said first, second and third multivibrators and including an output terminal;

said conductive means including a plurality of conductors formed so as to terminate on one edge of said security card and connected to respective second input terminals of said first, second and third AND gates and said plurality of input terminals of said OR gate, and to said output terminal of said fifth AND gate; and reset means coupled to said first, second, third and fourth bistable multivibrators for initializing the corresponding output terminals thereof whereby when a sequence of said input signals is applied on said conductors to said AND gates such that input signals are applied in order to said first, second and third AND gates, an output signal is developed on said output terminal of said fifth AND gate and when said input signals are applied in any other sequential order or to said fourth stage, said first, second, third and fourth AND gates are deactivated, said conductors applying said output signal to said indicating means to provide an indication when the proper sequence has been applied.

* * * * *

PO-1050
(5/69)

UNITED STATES PATENT OFFICE
CERTIFICATE OF CORRECTION

Patent No. 3,934,122 Dated January 20, 1976

Inventor(s) JAMES A. RICCITELLI

It is certified that error appears in the above-identified patent and that said Letters Patent are hereby corrected as shown below:

Column 2, line 60, after "of" (first occurrence) insert --the--;

Column 2, line 60, after "flip-flops" delete the words "flip-flots";

Column 4, line 26, "disenable" should read --disable--;

Column 5, line 2, after "at" insert --the--.

Signed and Sealed this

*thirteenth* Day of *April 1976*

[SEAL]

*Attest:*

RUTH C. MASON
*Attesting Officer*

C. MARSHALL DANN
*Commissioner of Patents and Trademarks*